United States Patent [19]

Toole et al.

[11] 4,406,989

[45] Sep. 27, 1983

[54] AUTOMATIC LEVEL CONTROL CIRCUIT

[75] Inventors: Pierce C. Toole, Cocoa; Dennis M. McCarthy, Rockledge, both of Fla.

[73] Assignee: The United States of America as represented by the Administrator of the National Aeronautics and Space Administration, Washington, D.C.

[21] Appl. No.: 284,288

[22] Filed: Jul. 17, 1981

[51] Int. Cl.³ ............................................. H03F 3/18
[52] U.S. Cl. ..................................... 330/110; 330/282
[58] Field of Search ................ 330/110, 129, 278, 282

[56] References Cited

U.S. PATENT DOCUMENTS 3,094,675 6/1963 Ule ........................................ 330/300
3,581,224 5/1971 Nercessian ........................... 330/110

OTHER PUBLICATIONS

Edward Nossen, "A Non-Linear Noise Filter", RCA Technical Notes, No. 266, Jun. 1959.

Primary Examiner—James B. Mullins
Assistant Examiner—Gene Wan
Attorney, Agent, or Firm—James O. Harrell; John R. Manning

[57] ABSTRACT

An automatic level control circuit for an operational amplifier 16 for minimizing spikes or instantaneous gain of the amplifier at a low period wherein no signal is received on the input. The apparatus includes a multi-branch circuit which is connected between an output terminal 26 and a feedback terminal 34. A pair of zener diodes 50 and 52 are connected back-to-back in series with a capacitor 54 provided in one of the branches. A pair of voltage dividing resistors 44 and 46 are connected in another of the branches and a second capacitor 42 is provided in the remaining branch of controlling the high frequency oscillations of the operational amplifier.

6 Claims, 1 Drawing Figure

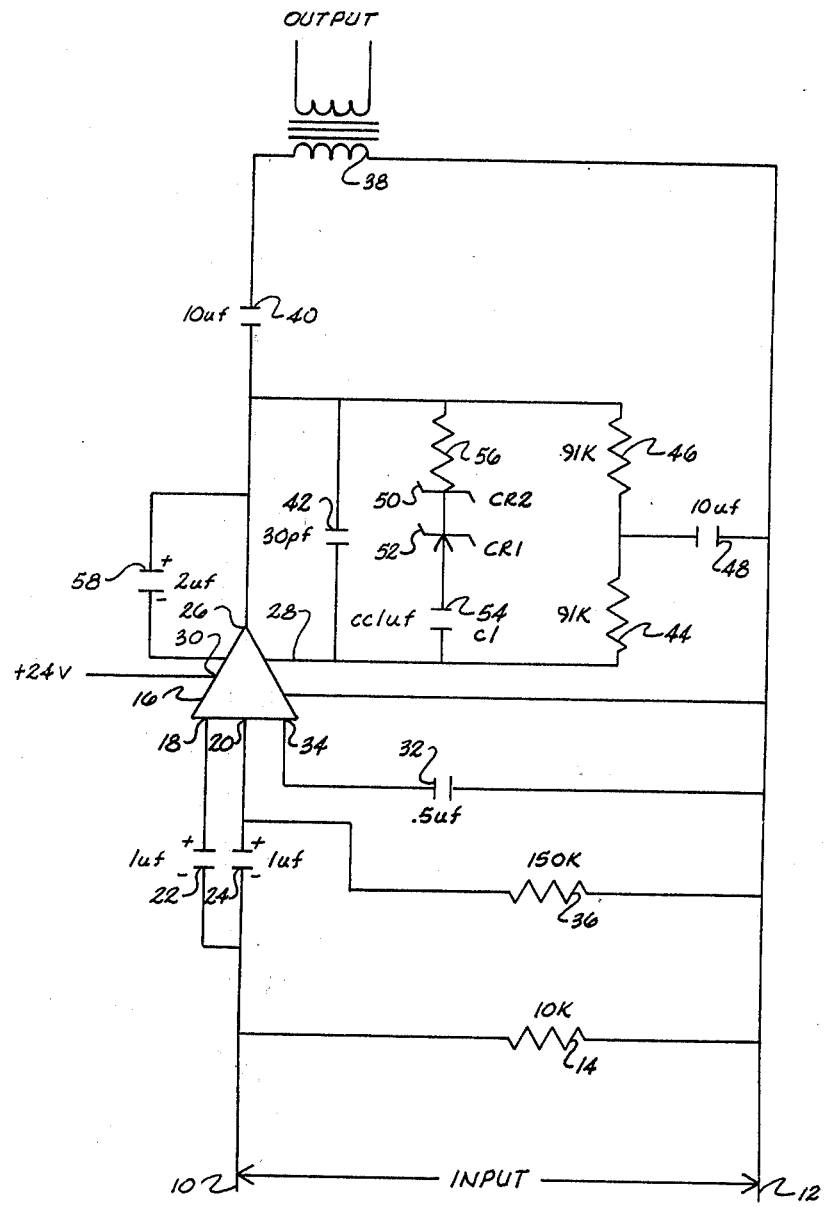

AUTOMATIC LEVEL CONTROL CIRCUIT

BACKGROUND OF THE INVENTION

Automatic level control circuits heretofore on the market utilized operational amplifiers that have feedback loop extending from the output terminal back to a gain control terminal so that as a voice signal exceeds a predetermined level zener diodes provided in a feedback circuit cause the gain of the operational amplifier to be reduced to a desirable level. In U.S. Pat. No. 3,459,179 there is disclosed a directly coupled non-linear feedback network for an operational amplifier which includes two pairs of diodes that are connected in the output and input terminals of the operational amplifier for reducing the gain of the operational amplifier in response to input signals having a magnitude exceeding a threshold overload value.

In U.S. Pat. No. 3,166,720 there is disclosed a linear amplifier with a non-linear feedback network. More particularly, this device pertains to a linear amplifier which has a predetermined finite forward impedance, and a feedback circuit adapted to remain open until the output voltage reaches a predetermined magnitude. Provided in the feedback circuit are zener diodes that are connected in a back-to-back arrangement. In U.S. Pat. No. 4,138,612 there is disclosed still another circuit for selecting a clipping level that includes a back-to-back connected zener diode. Similar circuits are disclosed in U.S. Pat. No. 3,153,152 entitled Variable Limitor for Analog Computer Using a Fixed Zener Diode, U.S. Pat. No. 3,268,830 entitled Operational Amplifier Gain Control Circuit Utilizing Non-linear Devices, and U.S. Pat. No. 3,094,675 entitled Degenerative Feedback Amplifier Utilizing Zener Diode. One problem with the above disclosed circuits is that after the circuits have been out of use for a period of time, if it receives a signal, this signal due to the high gain of the amplifier will initially appear at the output as a high amplitude signal or spike prior to the operational amplifier settling back to its normal operating amplitude.

SUMMARY OF THE INVENTION

This invention relates to an automatic level control circuit for reducing the instantaneous gain of an operational amplifier after a period of no signal input. The operational amplifier has input, output and feedback terminals. A supply voltage is connected to the operational amplifier. A multi-branch circuit is connected between the output terminal and the feedback terminal with the branches being in parallel with each other. In one of the branches there is a pair of zener diodes connected back-to-back in series with a capacitor. The zener diodes, which define the upper and lower levels of the instantaneous gain the operational amplifier and with the capacitor prevents spikes from appearing in the output signal after a period of no signal input. Normally, after the operational amplifier has not received a signal for a short period of time, the operational amplifier will assume the condition of highest gain of the circuit. As a result, when the first delta of an signal input is received by the circuit it would normally be amplified at the highest gain of the circuit. This would cause a sharp spike in the output signal prior to the gain of the circuit being reduced to its normal operating level. The capacitor in series with the zener diode, prevents this sharp spike. The capacitor acts as a D.C. blocking capacitor so that the D.C. bias applied by a voltage dividing circuit is not upset.

Accordingly, it is an important object of the present invention to provide a circuit to control the instantaneous gain of an automatic level control circuit when a signal is applied after a period of no signal input.

The construction designed to carry out the invention will be hereinafter described, together with other features thereof.

The invention will be more readily understood from a reading of the following specification and by reference to the accompanying drawings forming a part thereof, wherein an example of the invention is shown and wherein:

FIG. 1 is a schematic diagram of an automatic level control circuit modified in accordance with the present invention.

DESCRIPTION OF A PREFERRED EMBODIMENT

Referring to the drawing, an input signal is applied across leads 10 and 12. This input signal could be a tone or it could be a voice communications being transmitted over telephone circuits. An impedance matching resistor 14 is conncected across the leads 10 and 12. In order to control the gain of the input signal, an operational amplifier 16 is provided. In this particular circuit, the operational amplifier is an NE 570 operational amplifier. The operational amplifier has input terminals 18 and 20 which are connected by means of D.C. isolation capacitors 22 and 24 to the input lead 10.

The values of the various components used in the circuit will be given primarily to show the relationship between the various components. It is to be understood, of course, that the values of the components used in the circuit could be varied. In the particular circuit illustrated the capacitors 22 and 24 are one microfarads capacitors.

The operational amplifier has an output terminal 26, a feedback terminal 28 and a supply terminal 30.

A 0.5 microforads capacitor 32 is connected between an attack time-controlled terminal 34 and 24 return bus 12. The purpose of capacitor 32 is to control the time for the operational amplifier to latch onto the input signal. A 150 K resistor 36 is connected between input terminal 20 of operational amplifier 16 and lead 12. Resistor 36 is used to establish the amount of automatic gain control for the operational amplifier. A supply voltage of plus twenty-four volts is connected to terminal 30 of the operational amplifier.

Connected between the output terminal 26 of the operational amplifier 28 and a primary winding 38 of an output transformer is a 10 microforads coupling capacitor 40. Connected between the output terminal and the feedback terminal 28 are three parallel branches. In the uppermost branch is a capacitor 42. The purpose of capacitor 42 is to control high frequency oscillation of the operational amplifier. There is also a voltage dividing circuit which includes resistors 44 and 46. A ten microforads capacitor 48 is connected between the resistors 44 and 46 and the lead 12. The purpose of the voltage dividing circuit is to set the operating D.C. bias appearing on the output of the operational amplifier to one-half of the supply voltage which is the optimum operating point.

In the middle branch there are a pair of back-to-back zener diodes 50 and 52. In the particular circuit shown, the zener diodes are 1N702 zener diodes. Connected in series with the zener diodes 50 and 52 is a 0.001 microforads capacitor 54. The capacitor 54 has a two-fold function. One function is that it is D.C. blocking capacitor so that the bias established by the voltage dividing circuit which includes the resistors 44 and 46 is not upset. The second function is to control the frequency response of the operational amplifier.

In operation, when a signal is applied across the input terminal, if the capacitor 54 were not in the operation amplifier would not perform properly because the D.C. bus would be upset. However, by providing the capacitor 54 in series with the back-to-back zener diodes 50 and 52, the D.C. bus is maintained. In some circuits a resistor 56 is inserted in series with the zener diodes 50 and 52 to provide additional control of the gain of the operational amplifier. However, in many circuits, the additional resistor 56 is not needed. The small capacitor 54 gives the circuit a better frequency response. A conventional gain control capacitor 58 is connectd in a feedback circuit extending between output terminal 26 and terminal 60.

While a preferred embodiment of the invention has been described using specific terms, such description is for illustrative purposes only, and it is to be understood that changes and variations may be made without departing from the spirit or scope of the following claims.

What is claimed is:

1. An automatic level control circuit for an operational amplifier for minimizing the instantaneous gain of said amplifier after a period of no signal input, comprising:
   input, output and feedback terminals provided on said operational amplifier;
   a supply voltage connected to said operational amplifier;
   a voltage dividing circuit connected to said feedback terminal and said output terminal;
   a gain control feedback circuit connected between said output terminal and said feedback terminal;
   said gain control feedback circuit including:
   (i) a pair of zener diodes connected back-to-back, and
   (ii) a capacitor connected in series with said zener diodes.

2. The automatic gain control circuit as set forth in claim 1 further comprising:
   a resistor connected in series with said back-to-back zener diodes.

3. The automatic level control circuit as set forth in claim 1 further comprising:
   a second capacitor means connected between said output terminal and said feedback terminal in shunt with said gain control feedback circuit for controlling the high frequency response of said operational amplifier.

4. An automatic level control circuit for an operational amplifier for minimizing the instantaneous gain of said amplifier after a period of no signal input comprising:
   a pair of input lines;
   input, output and feedback terminals provided on said amplifier;
   one of said input lines being connected to said input terminal of said operational amplifier for supplying signals applied across said pair of input lines to said operational amplifier;
   a multi-branch circuit connected between said output terminal and said feedback terminal with said branches being in parallel with each other;
   a pair of zener diodes connected back-to-back in series with a capacitor provided in one of said branches;
   a pair of voltage dividing resistors connected in another of said branches; and
   a second capacitor provided in still another branch of said circuit for controlling the high frequency of said operational amplifier.

5. The automatic level control circuit of claim 4, further comprising:
   a resistor connected in series with said back-to-back zener diodes in said one of said branches.

6. The automatic level control circuit of claim 4, further comprising:
   a coupling capacitor connected to between said pair of voltage dividing resistors of said another branch and said other input line.

* * * * *